United States Patent [19]
Kuhn

[11] Patent Number: 5,810,728
[45] Date of Patent: *Sep. 22, 1998

[54] MR IMAGING METHOD AND APPARATUS FOR GUIDING A CATHETER

[75] Inventor: Michael H. Kuhn, Hamburg, Germany

[73] Assignee: U.S. Philips Corporation, New York, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 820,688

[22] Filed: Mar. 18, 1997

Related U.S. Application Data

[63] Continuation of Ser. No. 621,373, Mar. 25, 1996, abandoned, which is a continuation of Ser. No. 219,056, Mar. 29, 1994, abandoned.

[30] Foreign Application Priority Data

Apr. 3, 1993 [DE] Germany ............................ 43 10 993.4

[51] Int. Cl.$^6$ ................................................. A61B 5/055
[52] U.S. Cl. .......................... 600/410; 600/420; 600/424; 324/309
[58] Field of Search ............................... 128/653.2–653.5; 324/307, 309, 318, 322, 306; 600/410, 419, 420–424

[56] References Cited

U.S. PATENT DOCUMENTS

| | | |
|---|---|---|
| 4,572,198 | 2/1986 | Codrington . |
| 4,573,014 | 2/1986 | Riederer ................................. 324/307 |
| 4,634,979 | 1/1987 | Riederer et al. ....................... 324/307 |
| 4,770,182 | 9/1988 | Damadian et al. . |
| 4,835,690 | 5/1989 | Gangarosa et al. . |
| 5,501,218 | 3/1996 | Usui ....................................... 128/653.2 |
| 5,515,863 | 5/1996 | Damadian ............................. 128/653.4 |

FOREIGN PATENT DOCUMENTS

| | | | |
|---|---|---|---|
| 5269113 | 10/1993 | Japan .................................. 128/653.2 |
| 8502264 | 5/1985 | WIPO . |

OTHER PUBLICATIONS

"Tracking Of An Invasive Device Within An MR Imaging System", by C.L. Dumoulin et al, 11.SMRM, Aug. 1992, Book of Abstracts, p. 104.

*Primary Examiner*—Ruth S. Smith
*Attorney, Agent, or Firm*—Jack D. Slobod

[57] ABSTRACT

The invention relates to an MR imaging method in which a plurality of sequences, each of which comprises at least one RF pulse and at least one magnetic gradient field, act on an examination zone and in which at least one MR image is reconstructed from the MR signals thus acquired, and also relates to an apparatus for carrying out this method. Optimization can be achieved by subjecting the MR image to an analysis and by adjusting the variation in time of the RF pulses and/or the magnetic gradient field for the subsequent sequences in dependence on the analysis result. In particular, for positioning an object with suitable MR contrast in a body under examination at least one MR survey image of the body is formed prior to the introduction of the object. Then, after introduction of the object into the body, MR images of a small target region around and in front of the object are continuously formed and combined with the MR survey image for display purposes. The MR images of the target area are automatically analyzed to determine the location of the target region for the next MR image.

16 Claims, 2 Drawing Sheets

MR IMAGING METHOD AND APPARATUS FOR GUIDING A CATHETER

This is a continuation of application Ser. No. 08/621,373, filed Mar. 25, 1996, now abandoned which was a continuation of Ser. No. 08/219,056, which was filed on Mar. 29, 1994, now abandoned.

BACKGROUND OF THE INVENTION

1. Field of the Invention

The invention relates to an MR imaging method in which a plurality of sequences, each comprising at least one RF pulse and at least one magnetic gradient field, act on an examination zone and at least one MR image is reconstructed from the MR signals thus acquired.

2. Description of the Related Art

Methods of this kind and MR apparatus for carrying out these methods are well known. The operator can preset the variation in time of the RF pulses (inter alia their central frequency, their envelope and their amplitude) as well as the variation in time of the magnetic gradient fields (for example, their duration and amplitude as well as their position in time relative to the RF pulse or pulses). Once the data has been defined by the operator, however, for example in that the operator selects a given examination method and the so-called field of view, the variation in time of the RF pulses and the magnetic gradient fields is predetermined for the subsequent sequences. Whether or not optimum results are thus obtained is dependent inter alia on whether the operator has selected optimum parameters in view of the diagnostic requirements.

SUMMARY OF THE INVENTION

It is an object of the present invention to enhance the possibilities for optimization. This object is achieved in that the MR image is subjected to an analysis and that the variation in time of the RF pulses and/or the magnetic gradient fields for the subsequent sequences is varied in dependence on the analysis result. Thus, in accordance with the invention there is a feedback from the MR signals (or the MR images reconstructed therefrom) to the variation in time of the RF pulses and/or the magnetic gradient fields which themselves determine the MR signals or the MR image for the subsequent sequences. Various properties of the MR method can thus be optimized as desired by the operator, because the MR signal or the MR image is analysed in this respect and for the further MR method the variation in time of the RF pulses and the magnetic gradient fields is controlled in dependence on the analysis result.

It is to be noted that methods involving feedback are known per se, for example from EP-OS 439 119, in which the RF power is controlled thereby. These methods, however, are always based on the analysis of single MR signals and not on the analysis of an MR image formed from a number of such signals.

An apparatus for carrying out the method in accordance with the invention comprises
a) a gradient coil system for generating magnetic gradient fields in an examination zone which is subject to a steady, uniform magnetic field,
b) an RF coil system for generating an RF magnetic field and for receiving MR signals from the examination zone,
c) means for analysing an MR image reconstructed from a number of MR signals,
d) means for controlling the gradient coil system and/or the RF coil system for the subsequent sequences in dependence on the analysis result, and
f) means for displaying the resultant MR image.

The means for controlling the variation in time of the currents in the gradient coil system or the RF coil system thus close a loop which extends from the examination zone, via the RF receiving coil, to the gradient coil system or RF coil system acting on the examination zone.

The method in accordance with the invention can be used in a variety of ways to influence MR methods; the results thereof are dependent on which properties of the MR images are to be controlled. Some possibilities will be briefly described hereinafter.

One possible application is for so-called interventional examinations where medical instruments are introduced into a body so as to be displaced to a defined anatomic region. The best known example in this respect is digital subtraction angiography where a catheter is advanced through the vessels, under the control of fluoroscopy, until it reaches an examination point, for example in the vicinity of the heart, so that from that point contrast medium can be injected into the vessel (selective contrast medium injection). It is a drawback of this method that the patient and the attending staff are exposed to X-rays. Imaging methods based on magnetic resonance do not have this drawback and, moreover, reproduce contrasts of soft tissue better, generally speaking, than X-ray fluoroscopy images; however, it is hardly possible to achieve a position check equivalent to X-ray fluoroscopy by means of MR images, because they cannot be generated in such rapid succession as X-ray images.

A method of the kind set forth which is known from U.S. Pat. No. 4,572,198 utilizes a catheter which is provided with a loop conductor at its tip, which loop can be connected to a pulse current source via two foil leads inside the catheter. Upon introduction of the catheter MR images are produced, the pulse current source then being alternately switched on and off. The tip of the catheter is visible in these images because the pulse current source causes field distortion at that area. However, the resolution is thus limited exactly at the area of the tip of the catheter; this is a drawback, because the anatomic structures at this area, for example a bifurcation of the artery, should remain recognizable by the operator. When this method is used to image a sufficiently large area to provide the operator with an orientation as to which anatomic region of the body is being examined, only image sequences with intervals in time of a few seconds can be produced. This is slow in comparison with X-ray fluoroscopy, where 20 or more images can be produced within a second, so that the whole positioning operation using the known method is equally slow.

Another method is described by Dumoulin et al. in the article "Tracking of an Invasive Device within an MR imaging system" (printed in 11. SMRM, Aug. 92, Book of Abstracts, page 104). Therein, an RF receiving coil is connected to the tip of a catheter which can receive MR signals exclusively from its immediate vicinity. During the introduction of the catheter, MR images are formed on the basis of gradient echos, the gradient direction being changed after each RF pulse. The frequency of the spin resonance signals received during application of the magnetic gradient fields is linearly linked to the position of the RF receiving coil, so that the catheter tip can be localized by one-dimensional Fourier transformation of these signals; such localization is comparatively fast (for example, 20 times per second). This position is mapped in the MR images reconstructed from the gradient echo signals received by a further RF receiving coil. Again it is very difficult to image a region which is sufficiently large to enable anatomical orientation with a resolution which suffices for the reproduction of the fine structures in front of the catheter tip in the case of rapid succession of the MR images.

Moreover, this method has in common with the previously described method that the catheter, to be used only once for reasons of hygiene, is comparatively expensive because of the electric conductors incorporated therein.

The method in accordance with the invention enables positional checking of objects used for diagnosis or therapy in that for the positioning of an object with suitable MR contrast in a human or animal body at least one MR survey image is formed before introduction of the object, that after introduction of the object into the body MR images of a small target region around and in front of the object are continuously formed and combined with the MR survey image, that for the determination of the position of the front end of the object the MR images are automatically analysed, that on the basis thereof the position of the target region for the respective next MR image is determined, and that the variation in time of the magnetic gradient fields or the RF pulses is controlled accordingly.

When the principle of the invention is used in this manner, an MR survey image is thus generated prior to the positioning of the object with suitable MR contrast, preferably a catheter filled with an MR contrast medium. To this end, a three-dimensional data set can be acquired from the body region in which the positioning operation takes place; however, the MR survey image may also be formed by one or more two-dimensional slice images. This image may be comparatively large and have a suitable spatial resolution because a sufficient amount of time is available for generating the required MR data sets prior to positioning. It is merely necessary to ensure that the patient is immobilized so that motions, and hence changes in position relative to the survey image, are substantially avoided until positioning.

During the introduction of the catheter filled with contrast medium, MR images of a target region around and in front of the catheter tip are continuously generated, the area of the target region being small in comparison with the region reproduced by the survey image. Because of the small dimensions of the target region, the MR images of this region, generated in rapid succession, can have a sufficiently high resolution to enable suitable imaging of the tip of the catheter which is filled with the MR contrast medium for better visibility. This MR image is mapped in the MR survey image so that the radiologist can on the one hand suitably recognize the position of at least the catheter tip and on the other hand also derives suitable anatomical orientation from the MR survey image.

The position of the target region should change in conformity with the position of the catheter tip. To this end, using a suitable image processing method the position of the catheter tip in the MR image of the target region is automatically determined and therefrom the position of the target region for the next MR image is determined. The position of the target region is determined by the central frequency of the RF pulses. Thus, this frequency must be appropriately changed for the sequences for the next MR image. Consequently, the position of the MR image combined with or mapped in the MR survey image, as well as the catheter tip reproduced therein, continuously changes in the MR survey image, so that the radiologist experiences an image presentation which is comparable to X-ray fluoroscopy.

In a preferred embodiment of the invention, which is based on the assumption that the object is a catheter filled with a contrast medium, the direction of the catheter tip is automatically determined from the MR images and in dependence on this direction the gradient coils for generating the magnetic gradient fields active during the introduction of the catheter are controlled so that one magnetic gradient field extends in the direction of the catheter tip and the other magnetic gradient fields extend perpendicularly thereto. This version enables the execution of the method in accordance with the invention with a small volume of the target region, so that the resolution of the MR image and/or the frequency of recurrence of the MR images thus produced can be increased without the risk of the catheter tip leaving the target region so that it is no longer imaged.

In various applications it may occur that the region in which the catheter is to be displaced is so large that it cannot be covered by a single MR image. Therefore, in a further embodiment the body is moved to at least two defined positions in order to form the MR survey image, the MR survey image being composed from the MR sub-images thus acquired, the body being moved into the same positions upon introduction of the catheter so that the various body structures occupy the same position during acquisition of the MR sub-image on the one hand and of the MR image of the target region on the other hand. The MR sub-images may originate from a two-dimensional or three-dimensional data set. Because the body structures thus imaged occupy the same position during the acquisition of the MR images of the individual target regions as during the formation of the MR sub-images for the MR survey image, identical conditions occur in respect of the main field inhomogeneity and the gradient linearity, so that the distortion thus produced in the MR survey image on the one hand and in the MR images of the target region on the other hand is always the same.

In a further embodiment of the invention, which is based on the assumption that the catheter is introduced into an artery, the nuclear magnetization in the region behind the catheter tip is saturated during the introduction of the catheter. When the catheter is positioned within an artery, blood flows past the catheter within the artery. This blood could also be reproduced in high-resolution MR images of the target region, thus impeding the automatic evaluation of the MR images so as to determine the position or the direction of the catheter tip. This undesirable effect is at least reduced in that the nuclear magnetization in the region behind the catheter tip is saturated, so that the blood is no longer imaged when it subsequently flows past the catheter tip.

BRIEF DESCRIPTION OF THE DRAWING

The invention will be described in detail hereinafter with reference to the drawings. Therein.

DETAILED DESCRIPTION OF THE PREFERRED EMBODIMENTS

Figure 1:
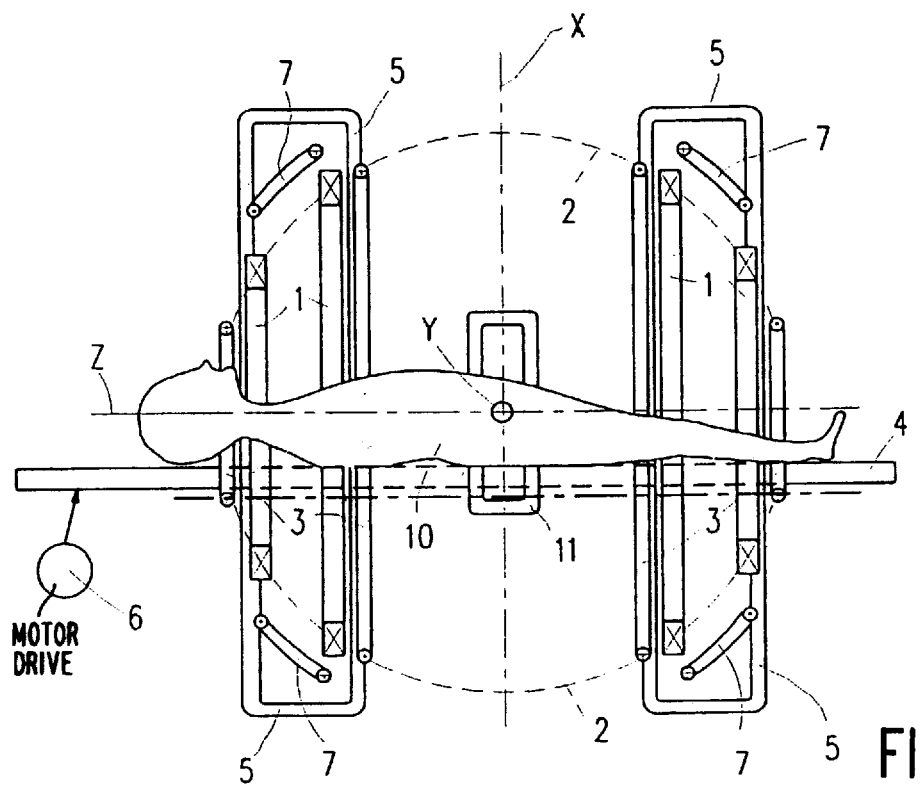
FIG. 1 shows a magnetic resonance examination apparatus for carrying out the method of the invention.

The magnetic resonance examination apparatus which is diagrammatically shown in FIG. 1 comprises an arrangement for generating a uniform, steady magnetic field, which arrangement consists of four coils 1 and which field may be of the order of magnitude of from some tenths of T (Tesla)

to some T. The coils 1 are concentrically arranged relative to the z-axis and may be provided on a spherical surface 2. The patient 10 to be examined is positioned within these coils, the patient being arranged on a table top 4 which is displaceable in the longitudinal direction of the patient by means of a motor drive 6, that is to say in the z-direction.

Four coils 3 are arranged on the spherical surface 2, or on a cylindrical surface, in order to generate a magnetic field which extends in the z-direction and which linearly varies in this direction. Also provided are four coils 7 which generate a magnetic gradient field which also extends in the z-direction (i.e. a magnetic field whose strength varies linearly in one direction), but whose gradient extends in the x-direction (vertically). A magnetic gradient field which extends in the z-direction and which has a gradient in the y-direction (perpendicularly to the plane of drawing of FIG. 1) is generated by four coils 5 which may be identical to the coils 7 but which have been rotated through 90° in space with respect thereto. Only two of these four coils are shown in FIG. 1.

Because each of the three coil systems 3, 5 and 7 for generating the magnetic gradient fields is symmetrically arranged relative to the spherical surface 2, the field strength at the centre of the sphere is determined exclusively by the steady, uniform magnetic field of the coil 1.

There is also provided an RF coil 11 which generates an essentially uniform RF magnetic field which extends perpendicularly to the direction of the steady, uniform magnetic field (i.e. perpendicularly to the z-direction). The RF coil 11 receives an RF-modulated current from an RF generator during each RF pulse. The RF coil 11 could also serve for receiving the spin resonance signals generated in the examination zone. Preferably, however, a separate RF receiving coil which is not shown in FIG. 1 is used for this purpose, in which case RF coil is solely an RF transmitting coil.

According to the method of the invention, a data set for an MR survey image is acquired from the patient 10 immobilized on the patient table 4. The data set may be a two-dimensional data set of a slice extending parallel to the plane of the table top, the thickness of said slice being such that it contains the arteries in which the catheter is to be displaced, but it may also be a three-dimensional data set (see U.S. Pat. No. 4,770,182) wherefrom a survey image with a presettable orientation can be formed.

The survey image should represent the entire region of the patient within which the catheter is to be displaced, for example the region between the thigh and the heart. Generally speaking, such a large region cannot be reproduced by means of a single MR survey image, because the steady magnetic field generated by the coils 1 exhibits the necessary homogeneity in a limited region only. Therefore, a plurality of MR survey images must be acquired, for example one each for the region of the thigh, the abdominal region and the cardiac region. During acquisition of the image of the abdominal region, respiration triggering should be performed or the patient should hold his breath and peristaltic motions should be suppressed, if necessary, by medication; during acquisition of the MR image of the cardiac region EKG triggering should be performed. Between the acquisitions for these regions the patient table is displaced to the position required for the imaging of the relevant next region, so that the region to be imaged is situated at the centre of the coils 4 and hence in the uniform region of the steady magnetic field; it is only the region of the thigh that should be shifted towards the centre so far that the thigh of the patient is accessible from the outside and the attending physician can still displace the catheter. This may give rise to geometrical image distortion at the area of the thigh (because of inhomogeneity of the magnetic field as well as gradient non-linearity); this distortion, however, is not disturbing because in this region merely the catheter motion is to be tracked.

During the acquisition of these MR data sets, the drive 6 is stationary; the positions occupied by the table top are stored. The data sets acquired in the various positions can subsequently be combined, in a computer, so as to form a complete data set of a single MR survey image; however, it is alternatively possible to use the three MR images separately, in which case slight overlapping of the individual sub-regions is to be preferred. Because in these images a comparatively large region is imaged with a high spatial resolution, even when fast gradient echo or spin echo methods are used to acquire the spin resonance signals required for imaging it will not be possible to achieve a succession of images which is fast enough to track the progress of the catheter.

After a survey image of the entire region or several survey images of sub-regions of the patient have thus been formed or stored, the catheter introduced into a thigh artery is filled with a suitable MR contrast medium (for example, GdDTPA or one of the newly developed "Blood Pool" contrast media), possibly in a suitable solution, and the catheter is slowly advanced. During this advancement MR images of a target region around and in front of the catheter tip are acquired in rapid succession, which small images are continuously mapped in the MR survey image so that a continuously updated image similar to X-ray fluoroscopy is obtained. Because always only a small target region is covered, adequate spatial resolution can be achieved despite the rapid succession of these MR images. This will be illustrated hereinafter with reference to the FIGS. 2 to 5.

Figure 2:
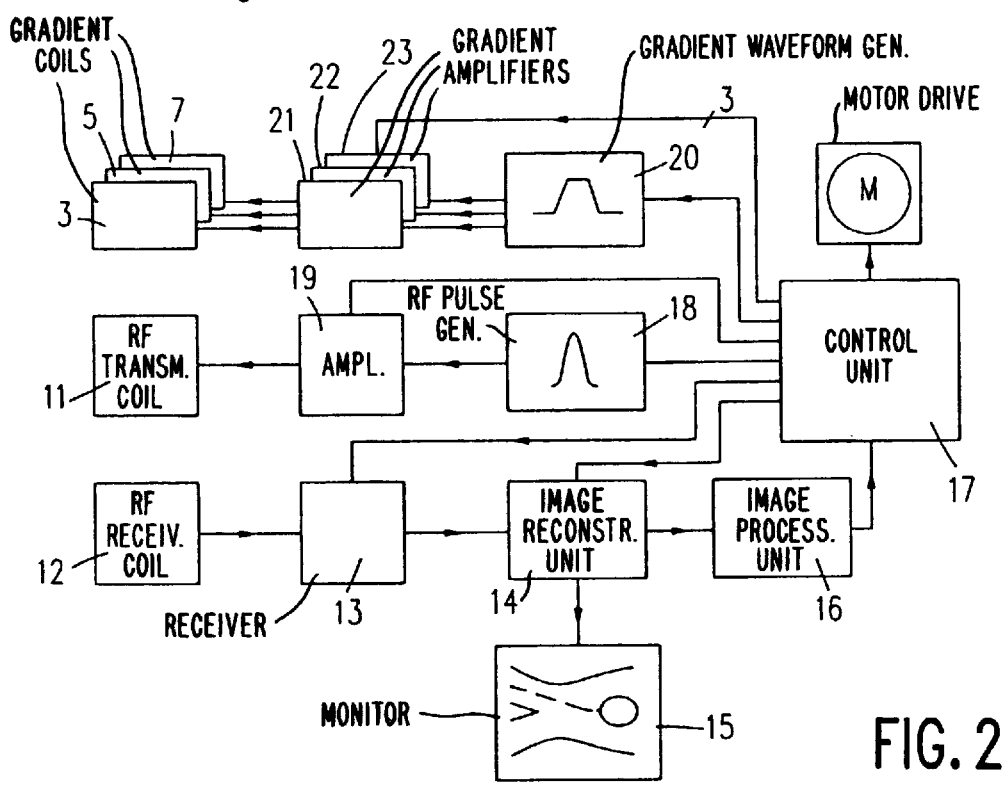
FIG. 2 shows a block diagram of such an apparatus.

The reference numeral 12 in FIG. 2 diagrammatically indicates the already mentioned RF receiving coil which picks up a number of spin resonance signals from the examination zone during each of these MR images. These signals are amplified in a receiver 13 and mixed with a signal of constant frequency so that a mixed product is obtained in the baseband; the signal thus obtained is subsequently digitized. The digitized signal is applied to an image reconstruction unit 14 in which an MR image of the target region is reconstructed. This MR image is mapped in the geometrically correct position in the survey image (i.e. the data sets of the MR image and the MR survey image in this region are combined) and the combined image thus formed is displayed on a monitor 15.

Figure 4:
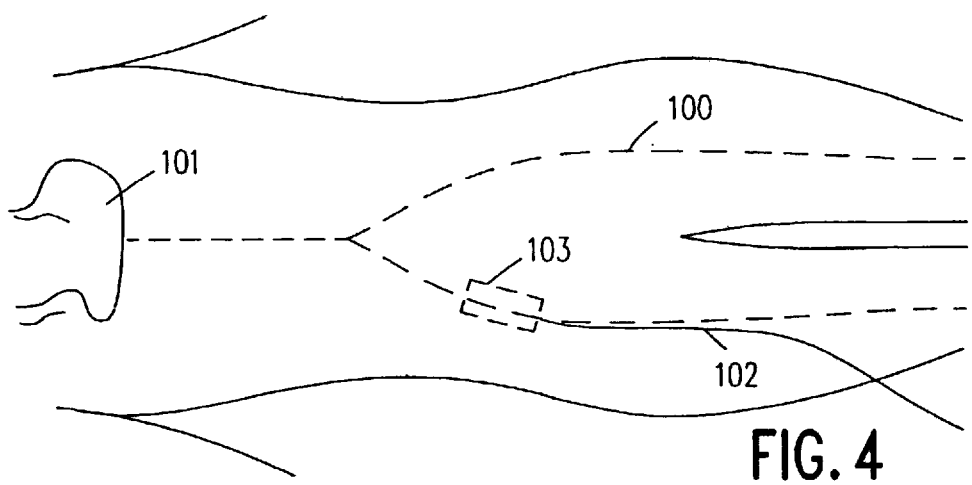
FIG. 4 shows a survey image of the body to be examined.

FIG. 4 shows diagrammatically the part of the patient represented in the survey image. The arteries 100, extending from the thighs to the heart 101, are denoted by dashed lines. A catheter 102 is introduced into one of these arteries. This catheter, which may have an inner diameter of 1 mm, is shown in a position adjacent the arteries for the sake of clarity; evidently, however, it is situated inside the artery whose inner diameter is substantially larger than the outer diameter of the catheter. Dashed lines in FIG. 4 denote a target region 103 which is situated around and in front of the catheter tip and whose direction corresponds to the direction of the catheter tip, so that it extends at least substantially in the direction of the part of the artery situated in front of the catheter tip. This target region, which may but need not necessarily be mapped in the survey image, then constitutes the region of the patient which will be imaged by the next MR image. Hereinafter it will be illustrated how the position and the orientation of the target region for the next MR image are determined and how it is achieved that the next MR image relates exclusively to this target region.

The MR image of the comparatively small target region, reconstructed in the image reconstruction unit 14, is applied to an image processing unit 16 which detects the catheter tip. Because the catheter tip is filled with a contrast medium and has an elongate shape, it is comparatively easy to establish the boundary in the MR image (determined by a given row or column of the MR image) to one side of which contrast medium is present, whereas no contrast medium is present to its other side. This boundary defines the position of the catheter tip. When the pixels to the one side of the boundary in which the catheter area near its tip is imaged are also included, the direction of the catheter tip can also be readily determined from the MR image. The (three-dimensional) target region is then chosen so that a small part of the catheter tip still projects into this region and that the principal dimension of this region extends in the direction of the catheter, because the artery in the vicinity of the catheter tip will extend at least approximately in the direction of the catheter. This principal dimension of the target region must be large enough (for example, 64 mm) to ensure that, even in the case of rapid advancement of the catheter, in the next MR image the catheter tip will definitely be imaged within this target region. The dimensions of the target region in the direction perpendicular to the principal dimension should also be such that it is ensured that the catheter tip remains within the target region during the MR image, for example 16 mm.

Figure 5:
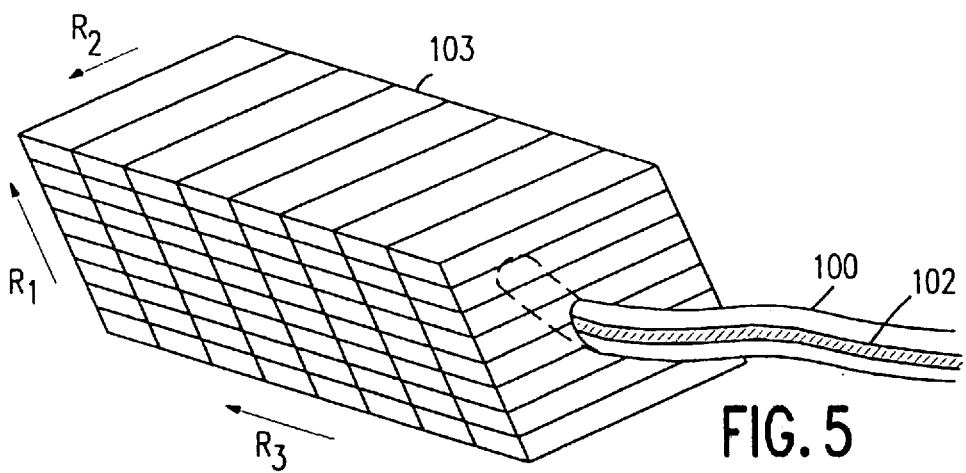
FIG. 5 shows the target region in relation to the artery.

FIG. 5 shows diagrammatically the artery 100, the catheter 102 present therein, and the associated target region 103. The principal dimension is denoted by the reference R3 and the other dimensions, extending perpendicularly thereto, by R2 and R1; R1 denotes the direction perpendicular to the table top (i.e. the x-direction in FIG. 1).

The position and the orientation (and possibly also the magnitude) of the target region for the next MR image are determined in a control unit 17 on the basis of the position and the direction of the catheter tip as determined by the image processing unit 16 on the basis of the preceding MR image. The control unit controls the currents for the RF coil 11 and for the gradient coils 3, 5 and 7 so that for the subsequent MR image spin resonance signals can be acquired exclusively from the previously calculated target region.

The variation in time of the magnetic gradient fields generated by the gradient coils 3, 5 and 7 is determined by a gradient waveform generator 20 which is controlled by the control unit 17 in dependence on the position and the orientation of the target region 103 given for the next MR image. In the known MR apparatus such a generator, generally speaking, stores a fixed number of precalculated waveforms, each time one of which can be selected. In accordance with the invention, however, the calculation of the variation in time of the magnetic gradient fields can take place only after evaluation of the preceding MR image in the unit 16. The waveform calculated in the unit 20 is applied to at least one of the gradient amplifiers 21, 22 and 23 which supply the current for the gradient coils 3, 5 and 7. The respective gain factors of the gradient amplifiers 21, 22 and 23 can be independently adjusted by the control unit 17.

When the direction of the magnetic gradient field coincides with one of the three directions x, y or z in an exceptional case, the magnetic gradient field will be generated only by the gradient coil system for the relevant direction (the gain factors for the gradient amplifiers feeding the other two gradient coils are then set to zero). In all other cases the magnetic gradient field is generated by at least two of the gradient coils, in which simultaneously currents flow which exhibit the same variation in time but, generally speaking, a different amplitude, so that the vectorial addition of the correspondingly weighted gradients produces the desired gradient direction.

The central frequency and the envelope of the RF pulses generated by the RF coil 11 are predetermined by a generator 18 which is also controlled by the control unit 17, in dependence on the position and the direction of the catheter tip as determined from the preceding MR image by the image processing unit 16. The control unit 17 also controls the gain of an amplifier 19, via which the RF signal supplied by the generator 18 is applied to the RF transmitter coil 11.

The control of the variation in time of the currents through the RF transmitter coil 11 and the gradient coils 3, 5 and 7 results in a feedback loop which enables optimization of given parameters for a subsequent MR image, being the position and the orientation of the target region 103 in the present example.

A sequence suitable for the acquisition of an MR image from the target region 103 could consist in excitation, by means of three mutually perpendicular RF pulses, of the nuclear magnetization outside three mutually perpendicular slices (extending in the directions R1, R2 and R3) whose area of intersection forms the target region, and in dephasing this nuclear magnetization by a subsequently activated magnetic gradient field so that for the time being no spin resonance signals can be received from the part of the patient which is situated outside the target region. The nuclear magnetization in the target region can then be excited by fast gradient echo sequences with a-RF pulses, resulting in fast imaging. This version also offers the advantage that the blood which is present in the artery in which the catheter 102 is positioned and which can flow past the catheter into the target region during acquisition of the data set for the next MR image has been "saturated", so that it does not contribute to imaging and the detection of the catheter tip is not impeded thereby.

Figure 3:
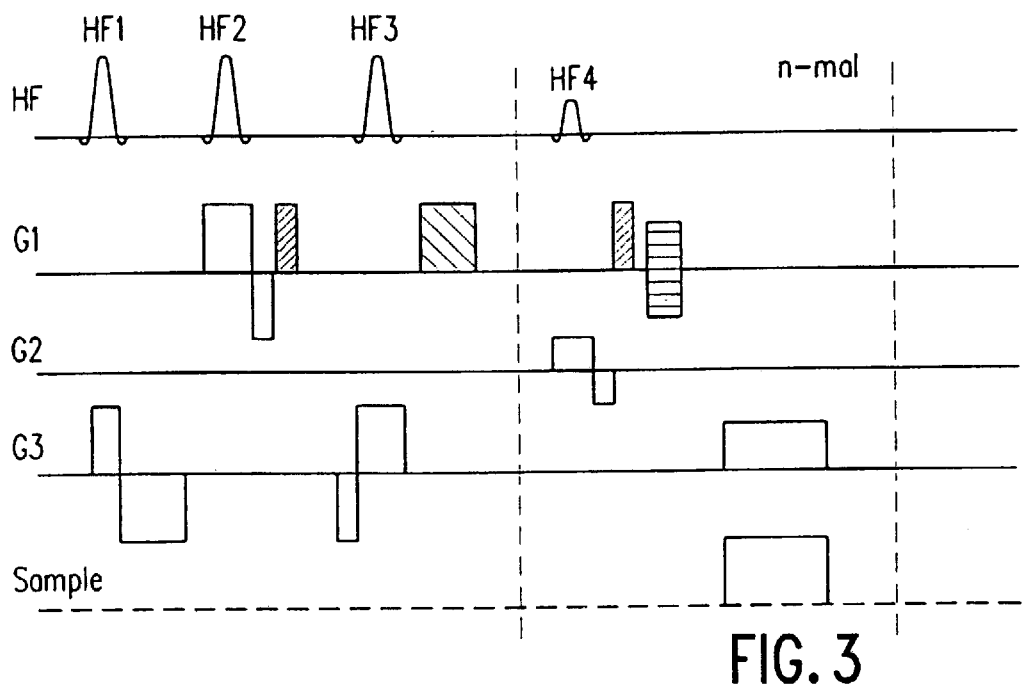
FIG. 3 shows the variation in time of various signals during a sequence for carrying out the method.

FIG. 3 shows a sequence which is based on a different principle (stimulated echo). The first line of FIG. 3 shows the position in time of the RF pulses, and the second through fourth lines show the magnetic gradient fields G1, G2, G3 which are active during or after the RF pulses and whose gradient corresponds to the direction of R1, R2 and R3, respectively, in FIG. 5. The fifth line shows the position in time of the interval in which the signals received by the RF receiving coil 12 are processed by the receiver 13.

The sequence commences with a first 90° RF pulse HF1 which is accompanied by a magnetic gradient field G3 whose gradient extends in the direction R3 (see FIG. 5). The central frequency of the RF pulse HF1, the value of the gradient of the magnetic gradient field G3 and its variation in time are chosen so that excitation and subsequent dephasing of the nuclear magnetization takes place in a slice which extends perpendicularly to the direction R3 and which adjoins the end of the target region 103 facing the thigh. As a result, the nuclear magnetization in the blood in the artery 100 present in this slice is dephased. When this blood subsequently flows past the catheter tip and into the target region 103, it no longer makes a contribution to the nuclear magnetization, thus facilitating the detection of the catheter tip by the unit 16.

Subsequently, there is generated a second 90° RF pulse HF2 which is accompanied by a magnetic gradient field G1.

This slice-selective RF pulse excites the nuclear magnetization in a slice which has a thickness of 16 mm and extends perpendicularly to the direction R1; however, unlike the RF pulse HF1, this slice-selective pulse is not accompanied by a subsequent dephasing of the nuclear magnetization. Subsequent to the RF pulse HF2 and before the next RF pulse a magnetic gradient field G1 with a gradient in the direction R1 is activated; this is a so-called spoiler. The spoiler serves to suppress the FID signals caused by the second RF pulse HF2.

Subsequently, a third 90° RF pulse HF3 is applied, again accompanied by a magnetic gradient field G3. The strength of the gradient G3 during the RF pulse, the central frequency of the RF pulse and its bandwidth are chosen so that the nuclear magnetization is excited in a slice which extends perpendicularly to the principal direction R3 of the target region 103 and which bounds this region at both sides. This slice may have a thickness of, for example 64 mm.

The RF pulse HF3 is succeeded by a further spoiler, i.e. a magnetic gradient field having a gradient extending in the direction R1. This spoiler serves to suppress the FID signal caused by HF3 and possibly the spin echo signals produced by cooperation between HF2 and HF3.

Finally, an RF pulse HF4 is applied. Contrary to the RF pulses HF1 . . . HF3, however, this RF pulse is not a 90° RF pulse, but a so-called α-RF pulse having a substantially smaller flip angle. In conjunction with a magnetic gradient field G2 (having a gradient extending in the direction R2), this RF pulse excites the nuclear magnetization in a slice which has a thickness of, for example 8 mm and which extends perpendicularly to the direction R2 and bounds the target region 103 on both sides in this direction. The three RF pulses HF2, HF3 and HF4 thus excite three mutually perpendicular slices which have a common area of intersection which corresponds to the target region 103.

After the RF pulse HF4, a further spoiler is switched on and off, which spoiler has the same gradient direction and the same time integral as the spoiler activated subsequent to the RF pulse HF2. This compensates for the effect of the first spoiler on the stimulated echo signal produced by the three RF pulses HF2 . . . HF4. This spoiler is followed by a phase encoding gradient which also extends in the direction G1 and subsequently a read gradient G3 which extends in the direction R3, i.e. in the principal direction of the target region, is activated and the spin resonance signal occurring during this read gradient, being a stimulated echo signal, is digitized by the receiver 13 (fifth line of FIG. 3).

The sub-sequence starting with the RF pulse HF4 and denoted by dashed vertical lines is repeated several times, for example eight times. As is denoted by dashed lines, the phase encoding gradient G1 is changed by one step for each repeat; the sub-sequence otherwise remains the same.

After these repeats, the MR image of the sub-region 103 can be reconstructed by two-dimensional Fourier transformation of the data sets produced by digitization. Because the duration of the sub-sequence is only a few milliseconds and it is repeated only a few times, further MR images can be formed in rapid succession, it being possible for the position and the direction of the target region to change from one image to another.

The spatial resolution that can be achieved in this manner is determined inter alia by the number of repeats and by the number of instants at which the spin resonance signal is sampled and digitized. In the case of eight repeats and sampling and digitizing of the spin resonance signal, occurring during the read phase, at eight instants after conversion into the baseband, the nuclear magnetization can be reconstructed in 8×8 voxels of the target region 103. The voxels, denoted by rectangular parallelepipeds in FIG. 5, in which the nuclear magnetization in the target region can be reconstructed are dimensioned 2×8×16 mm. Therefore, the resolution differs in the three directions R1, R2 and R3. Thus the fact is taken into account that the catheter tip also changes its position to a different extent in these three spatial directions.

The resolution in the principal direction R3 can be improved by sampling the spin resonance signal even more frequently during the read gradient; however, this is subject to the condition that the amplitude and/or the duration of the read gradient is increased. The resolution in the direction R1 can also be enhanced by repeating the sub-seuqence more often and by varying the phase encoding gradient G1 in even more steps; however, the recurrent frequency of the MR images is then also reduced. Similarly, while accepting a corresponding loss of time, one or more neighbouring slices in the direction R2 can be imaged in order to obtain a higher resolution.

When the target region passes the boundary between the regions recorded from separate positions upon the formation of the survey images, the patient table is advanced to the next position, so that in respect of inhomogeneity of the main field and non-linearity of the magnetic gradient fields the conditions are always the same as during the formation of the survey images.

When the catheter tip thus reaches the heart with continuous positional checking on the monitor 15, the contrast medium can be injected into the coronary arteries from the catheter and MR images of the coronary arteries filled with contrast medium can be formed in known manner.

The method in accordance with the invention can also be used for other interventional examinations, for example for the introduction of a fibre optical system into a body opening for example the oesophagus, for video endoscopy or for introducing an operating tool for minimum invasive surgery in a natural or operatively formed body opening. An object offering a suitable MR contrast, for example, a part of a catheter filled with an MR contrast medium, must then be connected to the tip of the fibre optical system or to the operating tool. The object, or the catheter part, in this case serves merely as an aid for the positioning of another instrument (fibre optical system or operating tool).

I claim:

1. A MR imaging method comprising: generating a plurality of sequences, each comprising one or more RF pulses and one or more magnetic gradient fields, which act on an examination zone to produce MR signals from which successive MR images can be constructed showing, over time, a region of a body including a moveable part; receiving the MR signals produced; reconstructing successive MR images from the MR signals received; automatically successively analyzing a plurality of the reconstructed MR images to determine the position of the moveable part in each current MR image being analyzed; and after each determination of position of the moveable part in a current MR image being analyzed, automatically adjusting a variation in time of at least one of the RF pulses and magnetic gradient fields for subsequent sequences in dependence on the determined position for producing the MR signals from which the next MR image of the successive MR images will be reconstructed.

2. A MR imaging method comprising the steps of: generating a plurality of sequences, each comprising one or more RF pulses and one or more magnetic gradient fields, which act on an examination zone to produce MR signals; receiving the MR signals produced; reconstructing an MR image from the MR signals received; automatically analyzing the reconstructed MR image; and adjusting a variation in time of at least one of the RF pulses and magnetic gradient fields for subsequent sequences in dependence on a result of said analyzing step, wherein said method is for acquiring successive images used for guiding positioning of an object, having a front end, introduced into a human or animal body, wherein said steps of generating sequences, receiving MR signals and reconstructing an MR image are for acquiring at least one MR survey image before introduction of the object into the body, and, after introduction of the object into the body, successively acquiring MR images of a target region around and in front of the object, which successively acquired MR images of the target region are small in comparison with the MR survey image, and further comprising the step of combining the successively acquired MR images of the target region with the MR survey image, and wherein said step of analyzing the reconstructed MR image is for determining the position of the front end of the object in the successively acquired MR images of the target region, and, on the basis of such determination of the position of the front end of the object, determining the position of the target region for a next one of the successive MR images of the target region to be acquired, and wherein the step of adjusting a variation in time of at least one of the RF pulses and magnetic gradient fields is in dependence on the determination of position of the target region for the next MR image of the target region to be acquired.

3. A method as claimed in claim 2, wherein said object introduced into the body is a catheter filled with contrast medium, which contrast medium is ejected from the catheter after a desired position has been reached.

4. A method as claimed in claim 3, wherein said step of analyzing the received MR signals is also for determining the direction of the catheter tip and the step of adjusting a variation in time is of the magnetic gradient fields such that during the introduction of the catheter the magnetic gradient fields are controlled in dependence on this direction so that one magnetic gradient field extends in the direction of the catheter tip whereas the other fields extend perpendicularly thereto.

5. A method as claimed in claim 4, wherein in conjunction with the step of generating sequences for acquiring the MR survey image the body is moved to at least two defined positions and the MR survey image is composed from at least two MR sub-images thus acquired with the body located in respective ones of the defined positions, and that during introduction of the catheter the body is moved to the same defined positions so that various body structures occupy the same location during acquisition of one of the MR sub-images as well as during acquisition of one or more of the successive MR images of the target region.

6. A method as claimed in claim 5, wherein the catheter is introduced into an artery, and said step of generating sequences is such that during the introduction of the catheter the nuclear magnetization in the region behind the catheter tip is saturated.

7. A method as claimed in claim 4, wherein the catheter is introduced into an artery, and said generating of sequences is such that during the introduction of the catheter the nuclear magnetization in the region behind the catheter tip is saturated.

8. A method as claimed in claim 3, wherein in conjunction with the generating of sequences for acquiring the MR survey image the body is moved to at least two defined positions and the MR survey image is composed from at least two MR sub-images thus acquired with the body located in respective ones of the defined positions, and that during introduction of the catheter the body is moved to the same defined positions so that the various body structures occupy the same location during acquisition of one of the MR sub-images as well as during acquisition of one or more of the successive MR images of the target region.

9. A method as claimed in claim 8, wherein the catheter is introduced into an artery, and said step of generating sequences is such that during the introduction of the catheter the nuclear magnetization in the region behind the catheter tip is saturated.

10. A method as claimed in claim 3, wherein the catheter is introduced into an artery, and said step of generating sequences is such that during the introduction of the catheter the nuclear magnetization in the region behind the catheter tip is saturated.

11. A MR apparatus comprising:
a) a magnet system for generating a steady uniform magnetic field in an examination zone,
b) a gradient coil system for generating magnetic gradient fields in the examination zone,
c) an RF coil system for generating an RF magnetic field and for receiving MR signals from the examination zone,
d) reconstruction means for reconstructing a MR image from the received MR signals,
e) analysis means for analyzing a MR image reconstructed by the reconstruction means to automatically determine the position of a moveable part in the MR image,
f) control means for controlling the gradient coil system and the RF coil system for producing a variation in time of currents in the gradient coil system and in the RF coil system and for controlling the reconstruction means and the analysis means in order to acquire and automatically determine the position of the moveable part in successive MR images of a region of a body in the examination zone, wherein after each determination of position of the moveable part in a current MR image of the successive MR images the variation in time of at least one of said currents is automatically adjusted in dependence on the determined position for producing the MR signals from which the next MR image of the successive MR images will be reconstructed, and
g) means for displaying the acquired successive MR images.

12. An MR apparatus, comprising:
a) a coil system for generating a steady uniform magnetic field in an examination zone,
b) a gradient coil system for generating magnetic gradient fields in the examination zone,
c) an RF coil system for generating an RF magnetic field and for receiving MR signals from the examination zone,
d) reconstruction means for reconstructing an image from the received MR signals,
e) analysis means for analyzing an MR image reconstructed by the reconstruction means,
f) control means for controlling the gradient coil system and the RF coil system for producing a variation in time of currents in the gradient coil system and in the RF coil system and for controlling the reconstruction means in order to acquire successive MR images of a region of a body in the examination zone, wherein for acquiring subsequent MR images the variation in time of at least one of said currents is adjusted in dependence on a result of analysis by the analysis means, and g) means for displaying the successively acquired MR images, wherein said control means controls said gradient coil system, said RF coil system and said reconstruction means for acquiring a MR survey image of the region of the body in the examination zone and for acquiring MR images of a target region which is small in comparison with the MR survey image, and wherein said analysis means comprises an image processing unit for detecting the position of a front end of an object with a suitable MR contrast in the MR images of the target region, and for defining the target region for a next MR image in dependence on the detected position and wherein said reconstruction means is configured for continuously mapping the successive MR images of the target region in the MR survey image.

13. A MR imaging method comprising: generating a plurality of sequences, each comprising one or more RF pulses and one or more magnetic gradient fields, which act on an examination zone to produce MR signals from which successive MR images can be constructed showing, over time, a region of a body; receiving the MR signals produced; reconstructing successive MR images from the MR signals received; automatically successively analyzing a plurality of the reconstructed MR images to determine a parameter in each current MR image being analyzed; and after each determination of the parameter, automatically adjusting a variation in time of at least one of the RF pulses and magnetic gradient fields for subsequent sequences in dependence on the determined parameter for producing the MR signals from which the next MR image of the successive MR images will be reconstructed.

14. A MR imaging method as claimed in claim 13, wherein said parameter is the position of a feature in the current MR image.

15. A MR apparatus comprising:

a) a magnet system for generating a steady uniform magnetic field in an examination zone, b) a gradient coil system for generating magnetic gradient fields in the examination zone, c) an RF coil system for generating an RF magnetic field and for receiving MR signals from the examination zone, d) reconstruction means for reconstructing a MR image from the received MR signals, e) analysis means for analyzing a MR image reconstructed by the reconstruction means to automatically determine a parameter in the MR image, f) control means for controlling the gradient coil system and the RF coil system for producing a variation in time of currents in the gradient coil system and in the RF coil system and for controlling the reconstruction means and the analysis means in order to acquire and automatically determine the parameter in successive MR images of a region of a body in the examination zone, wherein after each determination of the parameter in a current MR image of the successive MR images the variation in time of at least one of said currents is automatically adjusted in dependence on the determined parameter for producing the MR signals from which the next MR image of the successive MR images will be reconstructed, and g) means for displaying the acquired successive MR images.

16. A MR apparatus as claimed in claim 15, wherein said parameter is the position of a feature in the current MR image.

* * * * *